United States Patent [19]
Chaffin, III

[11] Patent Number: 5,242,709
[45] Date of Patent: Sep. 7, 1993

[54] METHOD FOR HARDENING ZINC SELENIDE AND ZINC SULFIDE

[75] Inventor: John H. Chaffin, III, Concord, N.C.

[73] Assignee: Litton Systems, Inc., Lexington, Mass.

[21] Appl. No.: 788,621

[22] Filed: Nov. 6, 1991

Related U.S. Application Data

[62] Division of Ser. No. 417,296, Oct. 5, 1989, Pat. No. 5,122,424.

[51] Int. Cl.$^5$ .............................................. C23C 16/22
[52] U.S. Cl. .................... 427/163; 427/164; 427/165; 427/166; 427/255.1; 427/255.2; 427/255.7
[58] Field of Search ............... 427/248.1, 255.1, 255.2, 427/255.7, 162, 164, 163, 165, 166

[56] References Cited

U.S. PATENT DOCUMENTS 3,849,244 11/1974 Groth .................................. 161/199
4,465,527 8/1984 Nishizawa ........................... 148/171
4,710,433 12/1987 Rowe et al. ......................... 428/623

FOREIGN PATENT DOCUMENTS 63-194340 11/1988 Japan .

OTHER PUBLICATIONS

Chang, S. K. et al., "Exciton transfer processes in $ZnSe_{1-x}Te_x$", Journal of Crystal Growth 117 (1992) pp. 793–796.

Lee, C. D. et al., "Free-exciton luminescence from $ZnSe_{1-x}Te_x$", Physical Review B vol. 45, No. 8 (Feb. 15, 1992) pp. 4491-4493.

Mach, R. et al., "ZnS:Te, A Blue Electroluminescence Emitter?", Journal of Crystal Growth 117 (1992) pp. 1002-1007.

*Primary Examiner*—Michael Lusigan
*Assistant Examiner*—Bret Chen
*Attorney, Agent, or Firm*—Michael H. Wallach; Robert F. Rotella

[57] ABSTRACT

A body resistant to abrasion and transmissive to light is provided which is formed essentially of zinc sulfide or zinc selenide having incorporated therein small amounts of tellurium. The body can form a layer over zinc sulfide, zinc selenide, or a conventional substrate such as glass. The substrate is thereby protected against fracture and erosion by environmental forces, such as high velocity impact with rain or other atmospheric particles, encountered by aircraft at high speed and over extended periods of time.

9 Claims, 3 Drawing Sheets

METHOD FOR HARDENING ZINC SELENIDE AND ZINC SULFIDE

This is a divisional of copending application Ser. No. 07/417,296 filed on Oct. 5, 1989, now U.S. Pat. No. 5,122,424.

BACKGROUND

Transparent exterior partitions of aircraft must be durable enough to secure operators and equipment from harsh environmental conditions. In addition, to enable operation of sensitive equipment employed in reconnaissance, such as is used for infrared imaging systems and for weapon delivery applications, these materials must be transmissive to light in a spectrum ranging from visible to infrared wavelenths.

Existing exterior partitions include barriers, such as large multispectral windows. Such windows often limit system design in FLIR (forward looking infrared) and infrared imaging systems. The inability of these windows to withstand rain abrasion has been a continuing problem for many years with no satisfactory solution still in sight.

Aircraft typically impact raindrops at high speed, necessitating an external barrier which is sufficiently strong to resist fracture. Raindrops also create minor indentations on the outer surface of conventional windows, imparting distortions to the optical quality of the partition and deleteriously affecting operators vision and the performance of equipment. In addition to strength and hardness, these materials must be resistant to rain or particle erosion caused by extended exposure in use of aircraft over long periods of time.

Thus, the materials of construction must be hard enough to withstand the abrasive effect of raindrops impacting transparent surfaces at high speeds. Further, increased hardness and strength of known materials must be accomplished without diminishing optical transmissivity.

A solution to problems of strength and hardness of optically transmissive barrier is formulation of materials which provide such a compromise of mechanical properites without deleteriously affecting optical quality. Equipment and operating systems housed within aircraft are constricted by the limitation of transparent partitions in the fuselage. Windows constructed of such materials must be formed so as to accommodate particular use requirements.

Attempts to increase the hardness and strength of known materials have included introduction of dopants to a coating material during chemical vapor deposition of that material onto a window or panel substrate. Common window substrates include glass, germanium (Ge), silicon (Si), zinc sulfide (ZnS), and zinc selenide (ZnSe). Dopants added have included arsenic, aluminum, and mixtures thereof. See, for example, Hardened CVD Zinc Selenide for FLIR Windows, Raytheon Company, Research Division, AFML-TR-75-142, dated September 1975. These efforts have all resulted in unacceptable loss of optical transmissivity (See pages 70-71 of the referenced research report).

A need exists, therefor, to preserve the high resolution capability of sophisticated reconnaissance and weapon delivery systems by increasing hardness, strength and durability of known protective window materials without diminishing their optical transmissivity.

SUMMARY OF THE INVENTION

The present invention discloses a method of forming a resultant ZnS or ZnSe structure and device which is highly resistant to abrasion without substantially diminishing the optical transmissivity properties of the constituent materials. Small amounts of tellurium (Te) are added to the optically transmissive zinc selenide or zinc sulfide material. Alternatively, a coating is applied to a suitable substrate, the coating being formed of zinc selenide or zinc sulfide which contains small amounts of tellurium.

In one embodiment, a body is formed of zinc sulfide or zinc selenide which contains small amounts of tellurium. The resultant article is highly resistant to abrasion, such as erosion caused by raindrops, yet is strong enough to withstand impact at high speed with raindrops.

In another embodiment, a coating of zinc selenide or zinc sulfide is disposed over a substrate. Small amounts of tellurium are incorporated within the zinc sulfide or zinc selenide which hardens the coating for impact resistance and abrasion resistance without diminishing transmission of light in the visible and infrared spectrums.

In yet another embodiment, a method and apparatus for abrasion resistance and transmission of visible and infrared light is provided in which zinc sulfide or zinc selenide vapor, and tellurium vapor are co-deposited over a substrate to form one or more optical layers comprising mixtures of zinc sulfide or zinc selenide having small amounts of tellurium.

The above, and other embodiments of the invention, will now be described, in detail.

DETAILED DESCRIPTION OF THE INVENTION

A body of ZnS or ZnSe with small amounts (less than about 2% Te by atomic weight) is formed which is highly resistant to abrasion caused by high velocity encounter with raindrops, without substantially diminishing the optical transmissivity properties of the ZnS or ZnSe material. Light energy may be transmitted through the body undiminished in intensity in the spectrum of wavelengths from visible to infrared. The body is highly resistant to erosion by environmental factors over long periods of time. The body can be formed as a window to provide visibility from within an aircraft. Because of increased strength and hardness of the present invention, large multispectral windows for aircraft can additionally be formed. Alternatively, the present invention can be contoured to form a portion of a fuselage. These bodies offer protection for many applications at low cost, in particular, for FLIR (forward looking infrared) and infrared imaging, such as are used for reconnaissance and weapon delivery systems.

Figure 1:
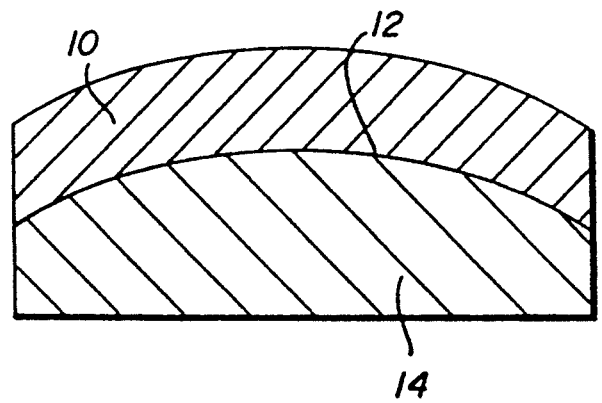
FIG. 1 is a sectional view of one embodiment of the present invention.

In one embodiment of the present invention, shown in FIG. 1, optical body 10 is formed essentially of zinc sulfide. Small amounts of tellurium are incorporated within the body to form a material which is impact resistant and erosion resistant to small airborne particles, such as rain, without diminishing optical transmissivity of the zinc sulfide. Optical body 10 can be formed over contoured surface 12 of a mandrel or graphite susceptor 14 which is later separated from optical body 10 or burned away. In an alternate embodiment, the optical body 10 is formed of zinc selenide having small amounts of tellurium incorporated within.

It is to be understood that "small amounts," as that term is used herein to describe the levels of tellurium incorporated with zinc sulfide or zinc selenide, means that tellurium comprises greater than about 0.05% and less than about 2% atomic weight of the zinc selenide or zinc sulfide material of the body or optical layer of the present invention. In the preferred embodiment of the invention, tellurium approximates 1% atomic weight of the doped zinc selenide or zinc sulfide.

Figure 2:
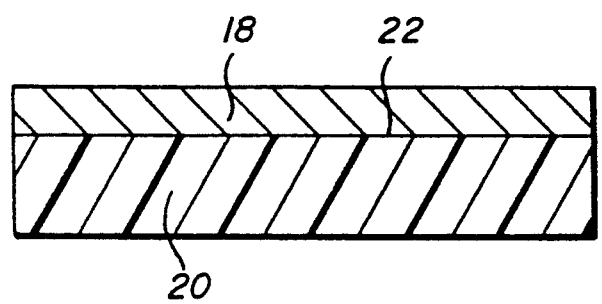
FIG. 2 is a sectional view of a second embodiment of the present invention.

As can be seen in FIG. 2, the present invention can also be embodied as a protective layer 18 of ZnS/Te or ZnSe/Te over a conventional optical body 20, such as glass. In this embodiment, protective layer 18 is formed over an outward surface 22 of the optical body 20 and is comprised essentially of zinc sulfide or zinc selenide, having incorporated therein small amounts of tellurium. Protective layer 18 thus protects the optical body 20 from impact and from wear caused by continuous exposure to harsh environmental elements.

Figure 3:
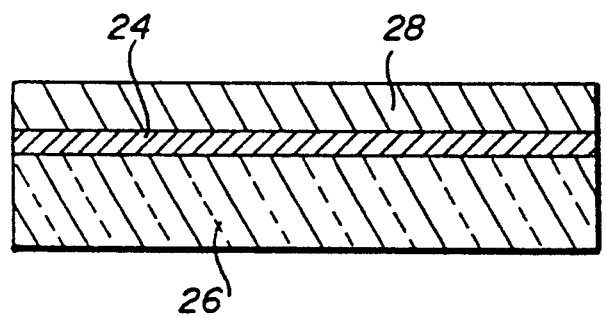
FIG. 3 is a sectional view of a third embodiment of the present invention.

Alternatively, adhesion layer 24 can be disposed between an optical body 26 and protective layer 28 for bonding protective layer 28 to optical body 26, as is shown in FIG. 3. Protective layer 28 can be comprised of zinc sulfide or zinc selenide and is hardened by having incorporated therein small amounts of tellurium. Thorium (IV) Fluoride (ThF$_4$) can be added to protective layer 28 to help bond protective layer 28 to adhesive layer 24. Optical body 26 can be zinc sulfide, zinc selenide, glass or some other conventional transparent or translucent aircraft shielding material. Adhesion layer 24, which is disposed between optical body 26 and protective layer 28, can be zinc sulfide or zinc selenide. In an optional embodiment, an external adhesion layer 30, shown in FIG. 4, can be disposed over the protective layer 28 and can consist essentially of zinc sulfide or zinc selenide. External adhesion layer 30 facilitates adherance of additional coatings or screens which can be applied over the present invention and prevents formation of a tellurium-rich layer distinct from protective layer 28.

In another embodiment, zinc sulfide or zinc selenide is hardened by a method of the present invention to form a layer which is abrasion resistant without substantially diminishing the optical transmissivity properties of the ZnS or ZnSe material. Vapors of zinc sulfide or zinc selenide and of tellurium vapor are formed by a physical vapor deposition (PVD) process in well known coating chambers, and subsequently co-deposited on optical body 20 (FIG. 2). Accumulation of the vapors co-deposited on the optical body 20 forms protective layer 18, comprising zinc sulfide or zinc selenide containing small amounts of tellurium, as seen in FIG. 2.

"Physical vapor deposition", or "PVD" as that term is used here, means deposition of vapors generated by molecular beam epitaxy (MBE), electron beam generation, thermal generation, sputtering or ion beam generation.

In another preferred embodiment of the invention, shown in FIG. 3, adhesion layer 24 and protective layer 28 are deposited on optical body 26 by sequential exposure of optical body 26 to vapors, thereby forming adhesion layer 24 and protective layer 28. Optical body 26 is exposed to zinc sulfide or zinc selenide, or mixtures of zinc sulfide or zinc selenide vapor with thorium (IV) fluoride vapors. Deposition of any of these vapors or mixtures of these vapors, as described, form adhesion layer 24, seen in FIG. 3. Adhesion layer 24 is subsequently exposed to a mixture of tellurium vapor and either zinc sulfide or zinc selenide vapor, which co-deposit on adhesion layer 24, to form protective layer 28, comprised of a compound or mixture of ZnS/Te or ZnSe/Te.

Figure 4:
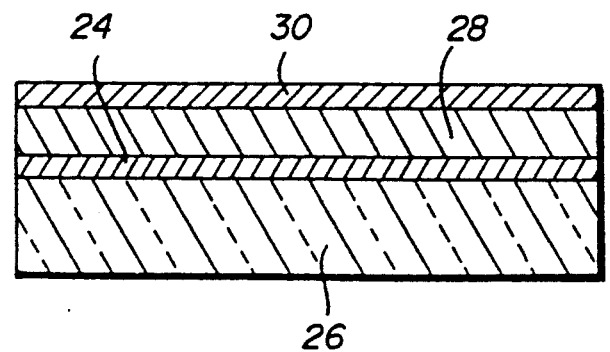
FIG. 4 is a sectional view of a fourth embodiment of the present invention.

As shown in FIG. 4, an external adhesion layer 30 can optionally be formed. Protective layer 28 (as previously described) is exposed to zinc sulfide or zinc selenide vapor in a PVD chamber. The vapor is then deposited on protective layer 28 to form exterior layer 30.

Protective layer 28 can be formed by PVD, wherein ZnS or ZnSe vapors and tellurium vapor are co-deposited on the adhesion layer 24 while the optical body 26 is brought to an elevated temperature by localized heating. The optical body 26 is heated by radiant heaters to approximately 150° C. during the coating steps. Optical body 26 is then exposed to vapor of zinc sulfide or zinc selenide, provided by an electron beam source, and of tellurium, which is formed at a temperature in the range of approximately 290° C. to 340° C. by a thermal source. The vapor mixture is then deposited on the cooler optical body 26 to form a protective layer 28.

The present invention is further described in the following examples, which are not to be considered limiting in any way.

EXAMPLES

Example 1

A glass optical body to be coated was exposed to two evaporation sources in a PVD chamber, each source was placed behind an independently operated shutter. Zinc sulfide constituted one evaporation source, and evaporation was generated by an electron beam source. The rate of zinc sulfide evaporation was controlled by a crystal rate monitor, which measures the rate of crystal deposition. A crystal rate monitor suitable for use in the method of the present invention is manufactured by Leybold-Inficon, Inc., Model XTC. Tellurium was placed in a refractory metal heater behind the second shutter and was evaporated from an aluminum oxide crucible. The rate of evaporation of tellurium was controlled by measuring the temperature of tellurium in the crucible. A thermocouple was placed in a quartz tube which was then placed in the crucible. Tellurium was then heated behind the shutter and stabilized at a desired temperature. The shutter securing zinc sulfide vapor heated by the electron beam was opened, exposing the optical body to zinc sulfide vapor. A few hundred angstroms of zinc sulfide was deposited on the optical body, and then the shutter securing tellurium vapor was then opened, so that zinc sulfide and tellurium were co-deposited on the glass substrate to form a hardened protective layer. When the desired protective layer had been deposited, the tellurium shutter was closed first and a few hundred angstroms of undoped zinc sulfide was deposited to form an exterior coating and thereby prevent formation of a tellurium-rich layer distinct from the protective layer and which aids in adhesion of additional layers such as a wire mesh. The zinc sulfide shutter was subsequently closed to conclude deposition of the external adhesion coating.

The rate of tellurium deposition was controlled by associating a desired vapor pressure with a given temperature determined by a crystal monitor, on the assumption that the rate of deposition would be proportional to a selected vapor pressure. After a measurable deposition rate which was associated with a known temperature, the temperature of the tellurium vapor source was reduced to obtain a desired deposition or "impingement" rate relative to the rate of deposition of zinc sulfide. In this example, the tellurium impingement rate was set at a value 100 times lower than the rate of zinc sulfide deposition, the tellurium source being approximately 320° C.

Example 2

Figure 5:
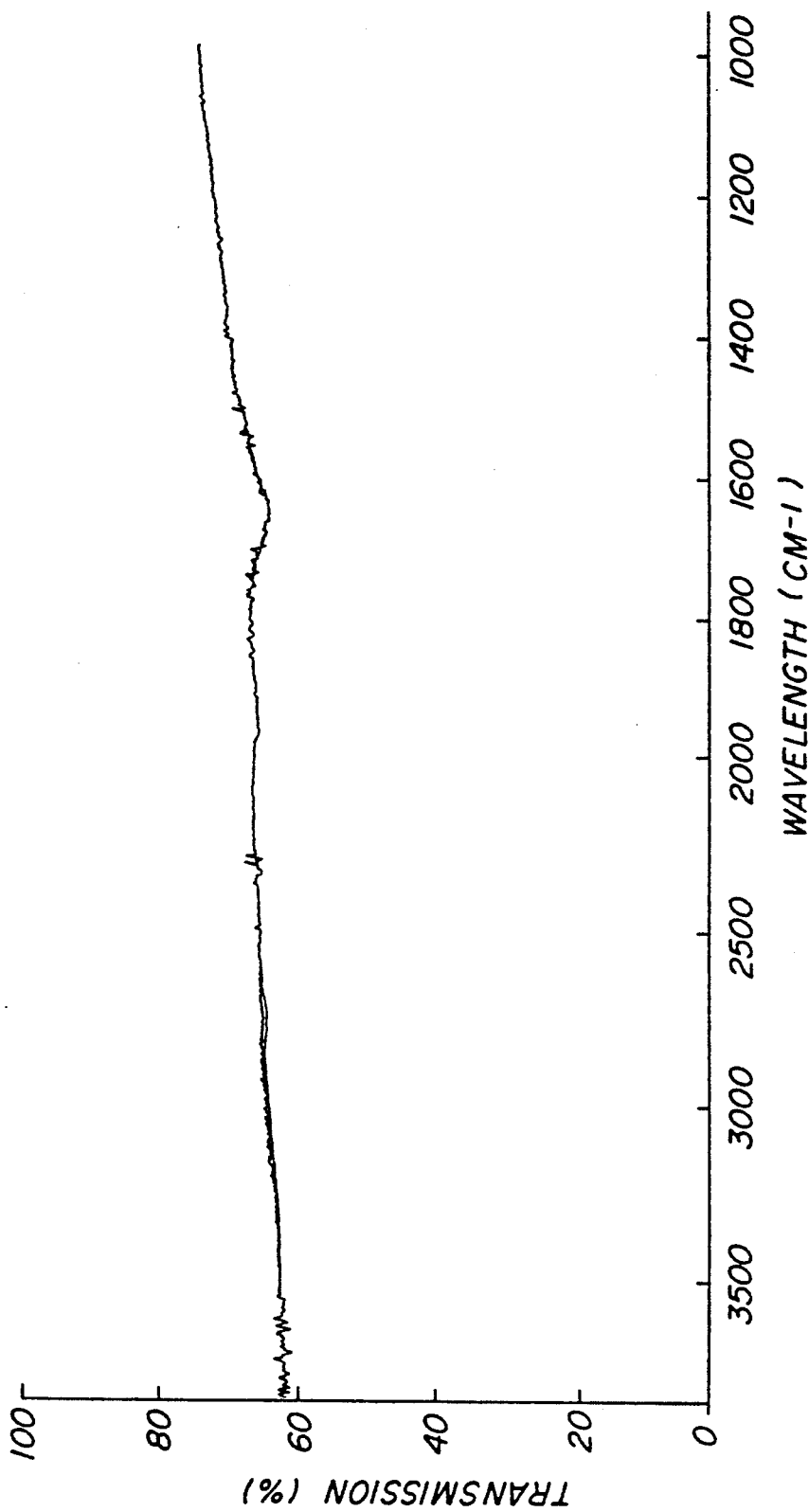
FIG. 5 shows measured transmissivity of infrared energy in wavelengths ranging from about 2.5 to 10 micrometers of an optical coating of the present invention over a zinc sulfide substrate as is described in Example 2.

Example 1 was repeated using zinc sulfide as an optical body. The protective layer formed was approximately 1 micrometer thick. FIG. 5 represents measured transmissivity of infrared energy in wavelengths ranging from 2.5 to 10 micrometers. As can be seen, within the limits of measurement, there was no adsorption or index change produced by Te doping.

Example 3

Figure 6:
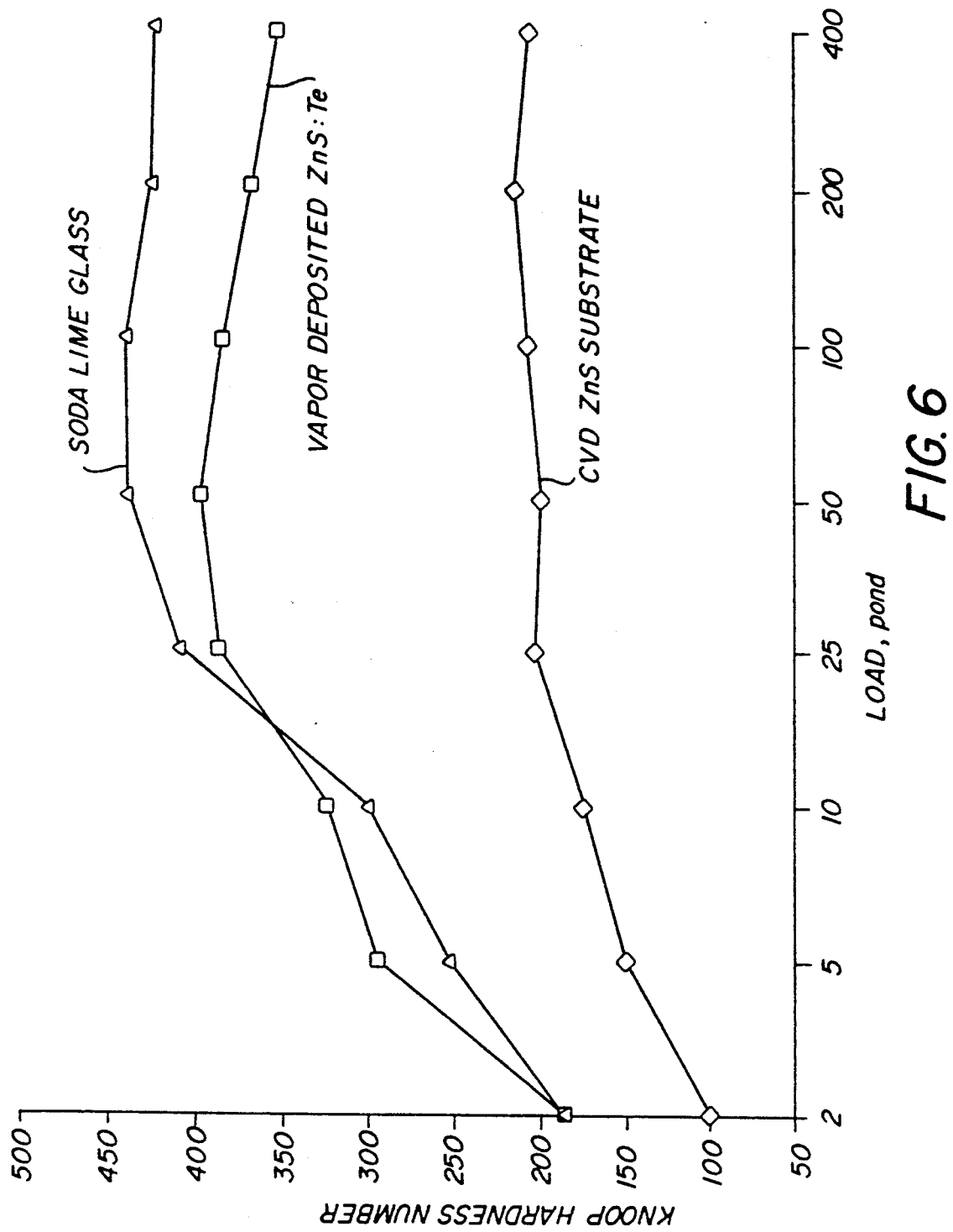
FIG. 6 shows measurements of Knoop hardness exhibited by the present invention as is described in Example 3.

The layer of Example 2 was repeated. The coating being 20 micrometers thick. The resultant material was crack resistant: Knoop hardness was measured and is shown in FIG. 6 relative to a chemical vapor deposition of zinc sulfide optical body and to soda lime glass.

Example 4

Samples of a zinc sulfide optical body coated as in examples 1, 2 and 3 were prepared having optical coating thicknesses of 9 micrometers, 18 micrometers and 27 micrometers. Erosion tests were conducted on these three samples measuring damage caused by 3.5 millimeter diameter raindrops impacted at a 60° angle of incidence at speeds of 1200 feet per second and 1600 feet per second. Vestigial damage was observed on all samples at 1200 feet per second. Samples retested at 1600 feet per second showed significant damage. Uncoated zinc sulfide optical bodies showed vestigial damage at 700 feet per second in similar tests.

Equivalents

It is to be understood that gallium arsenide (GaAs), germanium and silicon substrates are to be included as possible embodiments of optical bodies which can be coated with hardened ZnS or ZnSe according to the present invention. ZnS and ZnSe can comprise protective layers deposited in combination with small amounts of tellurium to harden such gallium arsenide, germanium and silicon optical bodies.

Further, deposition of ZnS and ZnSe with small amounts of tellurium can be deposited according to the present invention also by chemical vapor deposition (CVD).

Although only preferred embodiments have been specifically described and illustrated herein, it will be appreciated that many modifications and variations of the present invention are possible, in light of the above teachings, within the purview of the following claims, without departing from the spirit and scope of the invention.

I claim:

1. A method of hardening a material selected from the group consisting of ZnS and ZnSe for use as an aircraft optical window resistant to abrasion from impacting raindrops at high speed without substantially diminishing the optical transmissivity properties of the material, comprising the steps of forming a vapor consisting of said material and a Te vapor in the presence of an optical body and forming on the optical body a protective layer consisting of a mixture of said material and Te.

2. The method of claim 1 wherein the optical body is ZnS.

3. The method of claim 1 wherein the optical body is ZnSe.

4. The method of claim 1 wherein the optical body is selected from the group consisting of glass, zinc sulfide, zinc selenide, germanium, gallium arsenide and silicon.

5. The method of claim 1 wherein formation of layers is by physical vapor deposition.

6. The method of claim 1 wherein formation of layers is by chemical vapor deposition.

7. The method of claim 1 further comprising the steps of forming between the optical body and the protective layer an adhesion layer formed of a material selected from the group consisting of ZnS, ZnSe, ThF$_4$ and mixtures thereof.

8. The method of claim 1 further comprising the step of forming over the protective layer an external adhesion layer for preventing deposition of a tellurium-rich layer distinct from the protective layer.

9. A method of claim 1 wherein the optical body is approximately 150° C. during the coating steps and wherein the optical body is exposed to tellurium vapor which is at a temperature in the range of approximately 290° C. to 340° C. during deposition of the protective layer.

* * * * *